(12) United States Patent  
Egawa et al.

(10) Patent No.: US 6,995,038 B2  
(45) Date of Patent: Feb. 7, 2006

(54) METHOD OF MANUFACTURING SEMICONDUCTOR DEVICE

(75) Inventors: Yoshimi Egawa, Tokyo (JP); Akira Sugai, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/892,269

(22) Filed: Jul. 16, 2004

(65) Prior Publication Data

US 2005/0026418 A1 Feb. 3, 2005

(30) Foreign Application Priority Data

Jul. 31, 2003 (JP) .............................. 2003-284526  
Mar. 25, 2004 (JP) .............................. 2004-089168

(51) Int. Cl.  
*H01L 21/50* (2006.01)

(52) U.S. Cl. ...................... 438/106; 438/108; 438/111; 438/113; 438/123; 257/666; 257/778

(58) Field of Classification Search ..................... None  
See application file for complete search history.

(56) References Cited

U.S. PATENT DOCUMENTS 6,344,162 B1 * 2/2002 Miyajima ............. 262/272.14  
2002/0110956 A1 * 8/2002 Kumamoto et al. ........ 438/108

FOREIGN PATENT DOCUMENTS

JP 2000-260796 9/2000

* cited by examiner

*Primary Examiner*—David Nelms  
*Assistant Examiner*—Long Tran  
(74) *Attorney, Agent, or Firm*—Rabin & Berdo, P.C.

(57) ABSTRACT

A method of manufacturing a semiconductor device includes preparing a semiconductor wafer including a first main surface having a semiconductor device forming region and a peripheral region, and a second main surface; preparing first and second dies defining a cavity; holding the semiconductor wafer by the first die so that the first main surface is exposed; placing a film member on the second die; supplying a predetermined amount of resin to a predetermined region on a resin layout region of the film member; heating the first die and the second die; bringing the first die and the second die into contact with each other through the film member to form the cavity, thereby the first main surface and the resin are placed in the cavity; and pressure-reducing the interior of the cavity and reducing the capacity of the cavity to cause the molten resin obtained by melting the resin to contact the first main surface, thereby forming an encapsulating portion on the first main surface.

10 Claims, 8 Drawing Sheets

METHOD OF MANUFACTURING SEMICONDUCTOR DEVICE

BACKGROUND OF THE INVENTION

1. Field of the Invention

The present invention relates to a method of manufacturing a semiconductor device, and particularly to a method of manufacturing a semiconductor device, which is effective for application to a WCSP (Wafer Level Chip Size Package) in which a packaging process step is executed in a wafer process.

This application is counterpart of Japanese patent applications, Serial Number 284526/2003, filed Jul. 31, 2003, and Serial Number 89168/2004, filed Mar. 25, 2004, the subject matter of which is incorporated herein by reference.

2. Description of the Related Art

A package having a size substantially equivalent to that of a semiconductor chip is generally called "CSP (Chip Size Package)". CSPs obtained by packaging semiconductor chips formed in a semiconductor wafer while a semiconductor wafer state is being held as it is and bringing it into fractionalization, are called "WCSPs".

As a resin encapsulating process corresponding to one process for manufacturing a WCSP, there has been known a process using a mold upper die and a mold lower die.

There has been known an encapsulating process which makes use of a resin encapsulating die of a semiconductor wafer, which comprises a fixed mold upper die and a movable mold lower die disposed in a relationship opposite to the fixed mold upper die (see, for example, the following patent document 1).

The resin encapsulating process disclosed in the patent document specifically includes the following process steps.

That is, a film is disposed on the fixed mold upper die. A semiconductor wafer is placed on the movable mold lower die with a bump electrode mounting surface (electrode post mounting surface) being held up. A powdered or granular resin material is provided on the bump electrode mounting surface. After these both dies have been clamped, the dies are heated to melt the resin material.

Next, the film is brought into contact with bump electrode leading ends and the resin lying within each die is pressed through the film to thereby seal the bump electrode mounting surface of the semiconductor wafer with the resin. The dies are finally opened to peel off the semiconductor wafer out of the dies. A configuration has been disclosed wherein in this encapsulating process, the interior of each die is evacuated so as to reach a predetermined vacuum state.

Patent Document 1

Japanese Laid Open Patent Application No. 2000-260796

When the resin encapsulating process using the above dies of the WCSP includes the process of directly placing the pre-melting resin on the semiconductor wafer placed on the mold lower die, the pre-melting hard resin is brought into contact with the surface of the semiconductor wafer. Therefore, three is a fear of damage to the wafer surface or a fear of deformation of each bump electrode formed on the wafer. Since the pre-melting hard resin is in contact with the heated semiconductor wafer before the interior of each die is sufficiently brought into vacuum, a collection of air is easy to occur within the encapsulating resin. As a result, there was a fear that voids were apt to occur in the encapsulating resin. The occurrence of such voids means that the yield of each fabricated semiconductor device is reduced.

SUMMARY OF THE INVENTION

Therefore, the present invention has been made to solve the foregoing problems. An object of the present invention is to provide a resin encapsulating process capable of preventing voids from occurring in an encapsulating resin.

According to one aspect of the invention, for achieving the above object, there is provided a method of manufacturing a semiconductor device, comprising:

preparing a semiconductor wafer including-a first main surface and a second main surface opposite to the first main surface, the first main surface having a semiconductor device forming region and a peripheral region which surrounds the semiconductor device forming region;

preparing first and second dies defining a cavity;

holding the semiconductor wafer by the first die in so that the first main surface is exposed;

placing a film member on the second die;

supplying a predetermined amount of resin to a predetermined region on a resin layout region of the film member;

heating the first die and the second die;

bringing the first die and the second die into contact with each other through the film member to form the cavity, thereby the first main surface and the resin are placed in the cavity; and pressure-reducing the interior of the cavity and reducing the capacity of the cavity to cause the molten resin obtained by melting the resin to contact the first main surface, thereby forming an encapsulating portion on the first main surface.

According to the method of manufacturing the semiconductor device, according to the present invention, the main surface of the semiconductor wafer and the pre-melting resin are not brought into contact with each other before the pressure-reduction in the cavity. Thus, it is possible to prevent, for example, damage to the wafer surface and deformation of each bump electrode formed on the wafer. Further, the film member makes it easy to peel the encapsulating resin from the die. Thus, a high-reliable semiconductor device can be manufactured at good yield levels.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE INVENTION

Figure 1A:
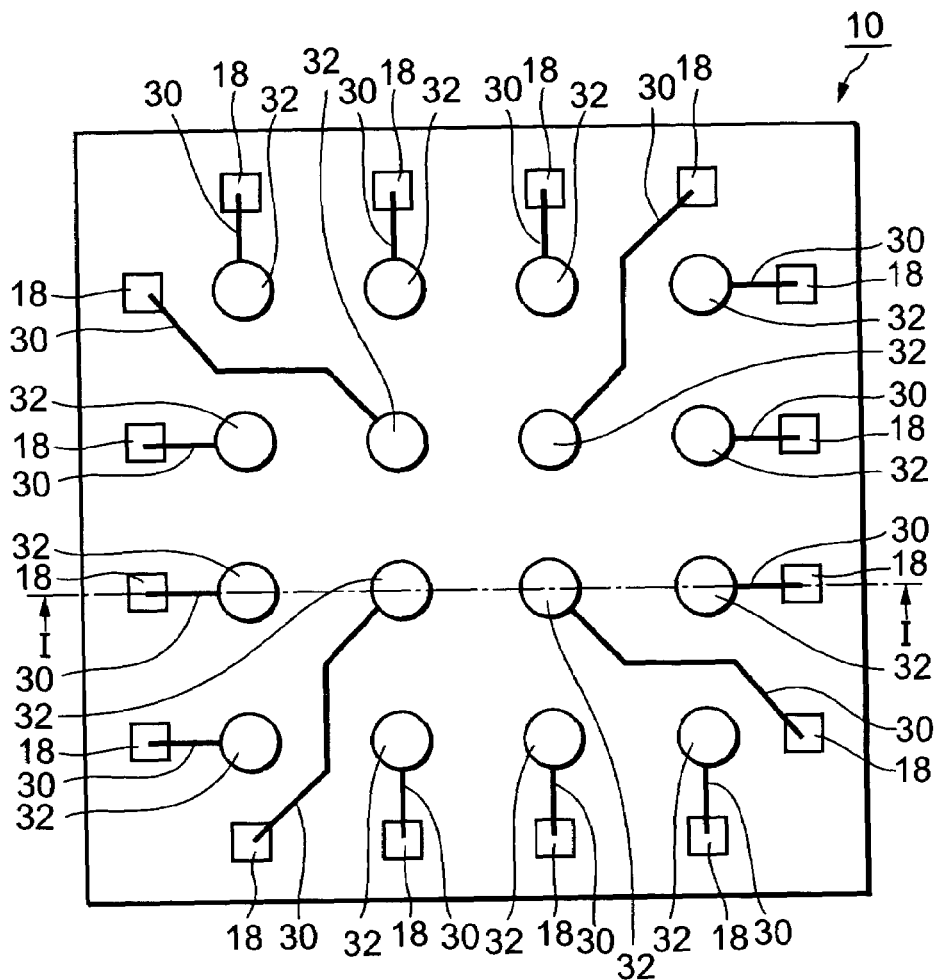
FIG. 1(A) is a transparent plan view for describing the relationship of layout of components as viewed from above a semiconductor device 10.

Preferred embodiments of the present invention will be described hereinbelow with reference to the accompanying drawings. Incidentally, the drawings merely schematically show the size, shape and positional relationships of respective components to such a degree that the present invention can be understood. Thus, the present invention is not limited thereto in particular.

Although special materials, conditions and numerical conditions or the like might be used in the following description, they are simply preferred examples. Hence no limitations are imposed on them. It should be understood that similar components illustrated in the respective drawings used in the following description are respectively identified by the same reference numerals, and the description of certain common components might be omitted.

<Configurational Example of Semiconductor Device>

First of all, a configurational example of a semiconductor device 10 formed by a manufacturing method according to the present invention will be schematically described with reference to FIG. 1.

Figure 1B:
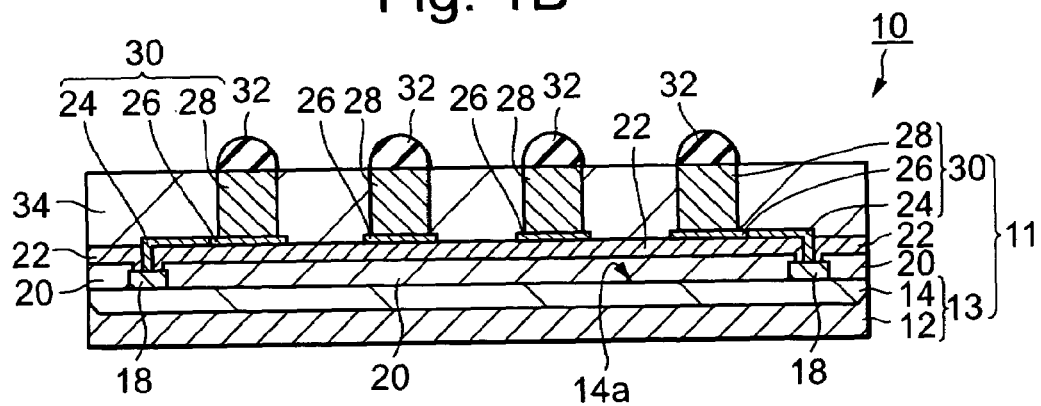
FIG. 1(B) is a typical cross-sectional view showing a cut region cut along a dashed line indicated by I—I of FIG. 1(A)

FIG. 1(A) is a transparent plan view for describing the relationship of layout of components as viewed from above the semiconductor device 10. In order to make it easy to understand each formed wiring structure, a sealing section being formed in practice on its upper side is shown so as to see therethrough. FIG. 1(B) is a typical cross-sectional view showing a cut region cut along dashed line indicated by I—I of FIG. 1(A).

The semiconductor device 10 has a WCSP structure. A constituent region of a circuit element, i.e., a required circuit element is formed according to a wafer process. Incidentally, a substrate region in which the constituent region of the circuit element is formed, is designated at numeral 14 in FIGS. 1(A) and 1(B). In the following description, the substrate region is called simply "device region 14". The device region 14 generally comprises a plurality of active elements each having an integrated circuit such as an LSI. A structure or structural body in which such a device region 14 is formed on the semiconductor substrate 12, is called "semiconductor body 13". In the semiconductor body 13, the surface 14a of the device region 14 is set as the surface of the semiconductor body 13.

Multilayered wiring structures (not shown and hereinafter called also "internal wirings") are normally formed in the device region 14. They are formed in such a manner that these plural active elements can fulfill predetermined functions in cooperation with one another. A plurality of electrode pads (hereinafter called also "circuit element connecting pads") 18 connected to the circuit element and wiring structures are provided on the device region 14 to configure a semiconductor wafer 11. According to the configuration shown in FIG. 1, the plurality of circuit element connecting pads 18 are provided along regions on the outer peripheral side in the region of the semiconductor wafer 11 in such a way as to become identical in pitch between the adjacent circuit element connecting pads 18.

A plurality of external terminals 32 regionrranged in an region on the center side of the semiconductor wafer 11, which is surrounded by the circuit element connecting pads 18.

The plurality of external terminals 32 are provided in such a way as to become equal in pitch therebetween.

The plurality of external terminals 32 are respectively, electrically connected to the plurality of circuit element connecting pads 18 by means of a plurality of wiring structures 30 of a so-called fan-in system.

As shown in FIG. 1(B), a passivation film 20 is formed on the semiconductor body 13 so as to expose respective parts of the circuit element connecting pads 18. An insulating film 22 is formed on the passivation film 20.

The insulating film 22 is provided so as to expose parts of the circuit element connecting pads 18. Wirings are connected to the circuit element connecting pads 18 exposed from the insulating film 22.

Each of the wiring structures 30 includes an electrode post 28 (called also "protruded electrode") electrically connected to its corresponding external terminal 32, and a redistribution wiring layer 24 which electrically connects the electrode post 28 and the circuit element connecting pad 18. Incidentally, part of the redistribution wiring layer 24 serves as an electrode post pad 26 and the electrode post 28 is electrically connected to its corresponding electrode post pad 26.

A sealing or encapsulating section 34 is provided on the insulating film 22 formed with the wiring structures 30, i.e., the redistribution wiring layers 24 so as to bury the electrode posts 28 and expose the top surfaces of the electrode posts 28 from the surface of the encapsulating section 34.

The external terminals 32 corresponding to, for example, solder balls are provided on their corresponding top surfaces exposed from the encapsulating section 34, of the electrode posts 28.

<Manufacturing Method of Semiconductor Device>

A method of manufacturing the semiconductor device 10 described with reference to FIGS. 1(A) and 1(B) will be schematically explained with reference to FIGS. 2(A) and 2(B) and FIGS. 3(A) through 3(C).

The semiconductor device 10 of the present invention is obtained by arranging and forming the semiconductor devices on the semiconductor substrate 12 in plural forms in the form of a matrix and thereafter bringing them into fractionalization.

Figure 2A:
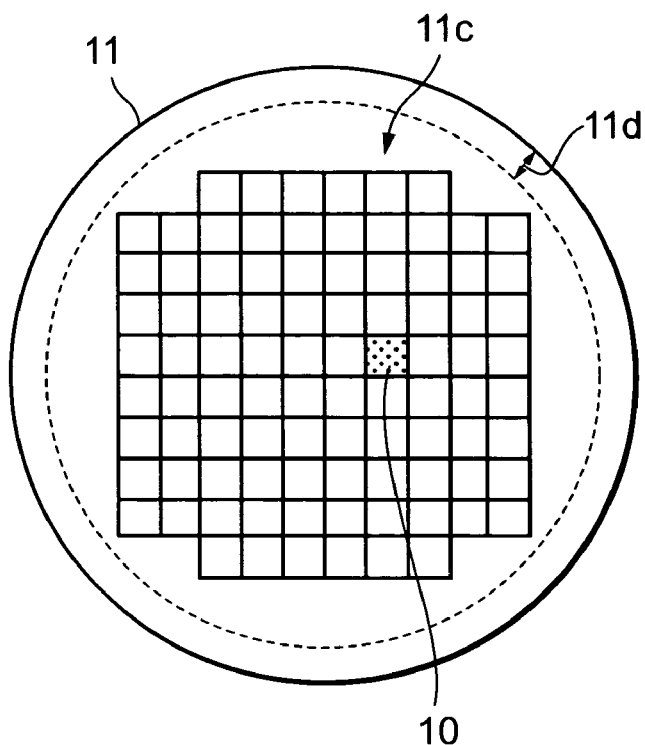
FIG. 2(A) is a schematic plan view of a semiconductor wafer 12 as viewed from thereabove.
Figure 2B:
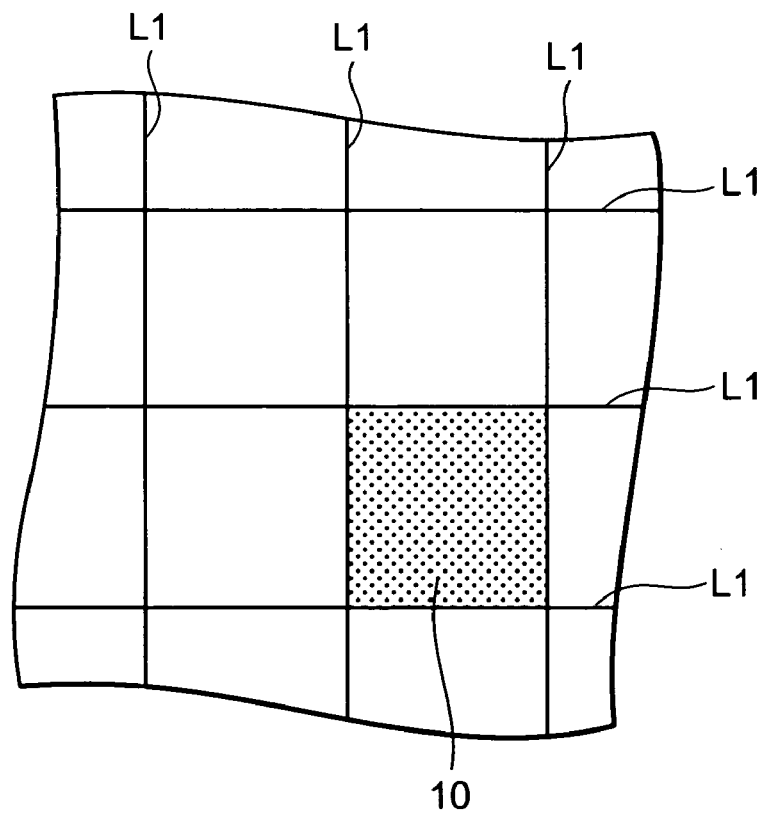
FIG. 2(B) is a schematic plan portion enlarged view showing a partial region of FIG. 2(A) in an enlarged form.

Referring to FIGS. 2(A) and 2(B), a process for manufacturing the semiconductor device 10 of the present invention will first be described in relation to a process for cutting out the semiconductor devices from the semiconductor wafer 11 to provide fractionalization.

FIG. 2(A) is a schematic plan view of the semiconductor wafer 11 placed in a state of having terminated a so-called wafer process and being not subjected to fractionalization, as viewed from above the semiconductor wafer 11. FIG. 2(B) is a schematic plan portion enlarged view showing a partial region of FIG. 2(A) in an enlarged form to explain the relationship in which a structure or structural body to assume the semiconductor device 10 upon fractionalization of the semiconductor wafer 11 is occupied or taken in the semiconductor wafer 11.

As shown in FIG. 2(A), a plurality of scribe lines L1 are formed in the semiconductor wafer 11 in lattice form. The semiconductor devices 10 are respectively formed in regions partitioned by these scribe lines L1.

A peripheral region 11d corresponding to a partial region unformed with the semiconductor devices 10 exists in the semiconductor wafer 11 along its outer periphery. A partial region of the semiconductor wafer 11, which is surrounded by the peripheral region 11d, is a semiconductor chip forming region 11c formed with the semiconductor devices 10.

Next, the periphery of the-semiconductor device 10 shown with being marked with dot patterns in FIG. 2(A) is illustrated in FIG. 2(B) in an enlarged form. In FIG. 2(B), scribe lines are shown with being designated at symbols L1. Regions partitioned by the scribe lines L1 respectively result in the semiconductor devices 10 when fractionalized.

That is, the individual semiconductor devices 10 are obtained, by being cut and fractionalized from the semiconductor wafer 11 along the first scribe lines L1.

A method of manufacturing the semiconductor device 10 will be schematically explained below with reference to FIG. 3.

Figure 3A:
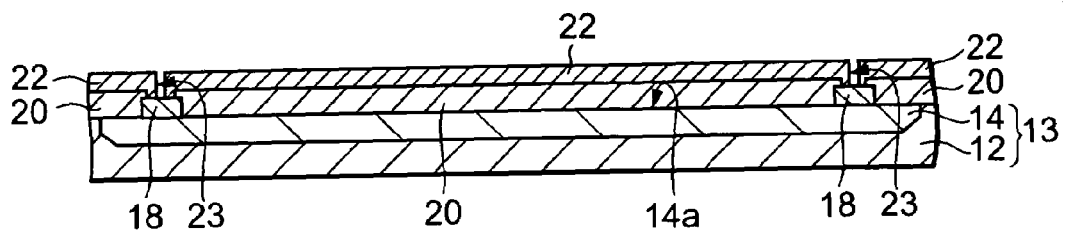
FIGS. 3(A), 3(B) and 3(C) are respectively schematic cross-sectional views showing a cut region cut in a manner similar to FIG. 1(B), of one structure being in the course of its manufacture with the one structure as a representative in order to describe a manufacturing process of a semiconductor device.
Figure 3B:
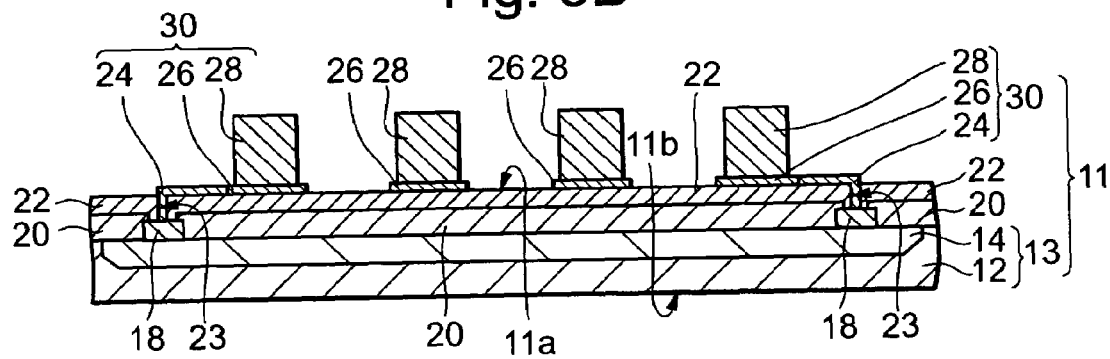
Figure 3C:
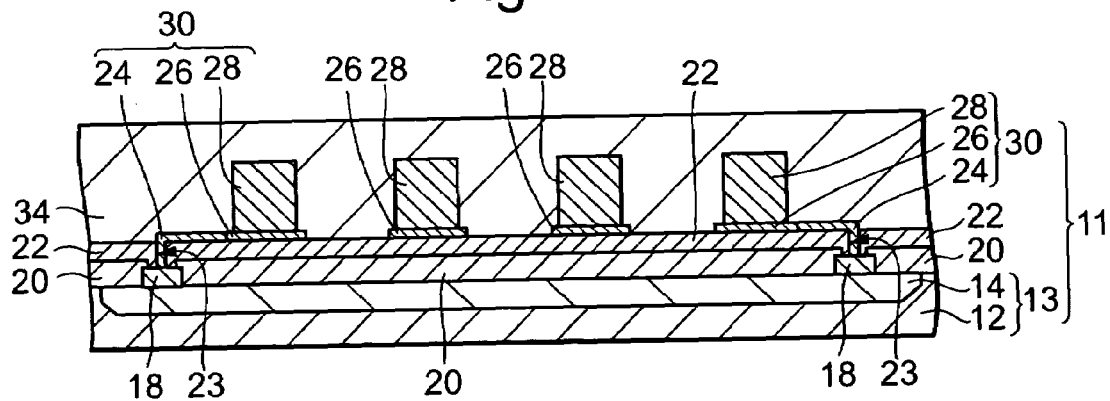

FIGS. 3(A), 3(B) and 3(C) are respectively schematic cross-sectional views showing a cut region cut in a manner similar to FIG. 1(B), of one structural body being in the course of its manufacture with the one structural body as a representative in order to describe a manufacturing process.

As shown in FIG. 3(A), a device region 14 constituting a circuit element containing a plurality of active elements or the like is fabricated and built in a semiconductor substrate 12 corresponding to a silicon (Si) substrate according to a normal wafer process.

As is well known, the plurality of active elements are interconnected with one another by means of multilayered wiring structures (not shown) and formed so as to be capable of fulfilling predetermined functions.

Circuit element connecting pads 18 constituted with a kind of alloy selected from an alloy containing Al (Aluminum), an alloy containing Au (gold) and an alloy containing Cu (Copper) as the material are formed on a surface 14a of the device region 14.

Next, a passivation film 20 constituted using, for example, a silicon nitride film (SiN) is formed on the semiconductor substrate 12 with a thickness that ranges from about 0.5 to 1.0 μm.

The passivation film 20 is formed with openings, i.e., windows that expose parts of the circuit element connecting pads 18.

Next, as shown in FIG. 3(B), polyimide used as, for example, an insulating material is coated on the passivation film 20 with a thickness of about 10 μm by the conventional known spin coat method (spin applying method) to form an insulating film 22. Openings 23 that expose parts of the circuit element connecting pads 18 are defined in the insulating film 22.

Next, wiring structures 30, which are connected to their corresponding circuit element connecting pads 18 and lead out from the openings 23 to over the insulating film 22, are formed to obtain such a structural body as shown in FIG. 3(B), i.e., a semiconductor wafer 11.

As shown in FIG. 3(B), redistribution wiring layers 24 that lead out from the openings 23 are formed on the insulating film 22.

Subsequently, electrode posts 28 are formed on the formed redistribution wiring layers 24. This process is done as, for example, a process for plating copper (Cu) used as a conductor by the conventional known method and thereafter removing resists patterned by the known photolithography technology with each resist as a mask, whereby the electrode posts 28 are formed thereon.

The electrode posts 28 may preferably be configured as columns whose sectional shapes normal to their extending directions (upward and downward directions as viewed on the sheet in the figure) become circles.

The semiconductor wafer 11 having the semiconductor body 13, the passivation film 20, the connecting pads 18, the insulating film 22 and the wiring structures 30 is formed in this way.

Thereafter, as shown in FIG. 3(C), an encapsulating section 34 is formed on the semiconductor wafer 11 by using, for example, an epoxy mold resin.

Next, a grind process is effected to expose the top surfaces of the electrode posts 28 from the encapsulating section 34.

The semiconductor wafer 11 placed in the completed state of packaging is brought into fractionalization by being cut along the scribe lines L1 shown and already mentioned in FIG. 2(B).

Thus, a plurality of the semiconductor devices 10 each having the structure described using FIG. 1 can be fabricated from one wafer.

An encapsulating or sealing process employed in the method of manufacturing the semiconductor device, according to the present invention will be explained below.

<Description of Configuration of Die>

A configurational example of a sealing device (dies) suitable for application to the manufacturing method of the present invention will first be explained using FIGS. 4 and 5.

Figure 4A:
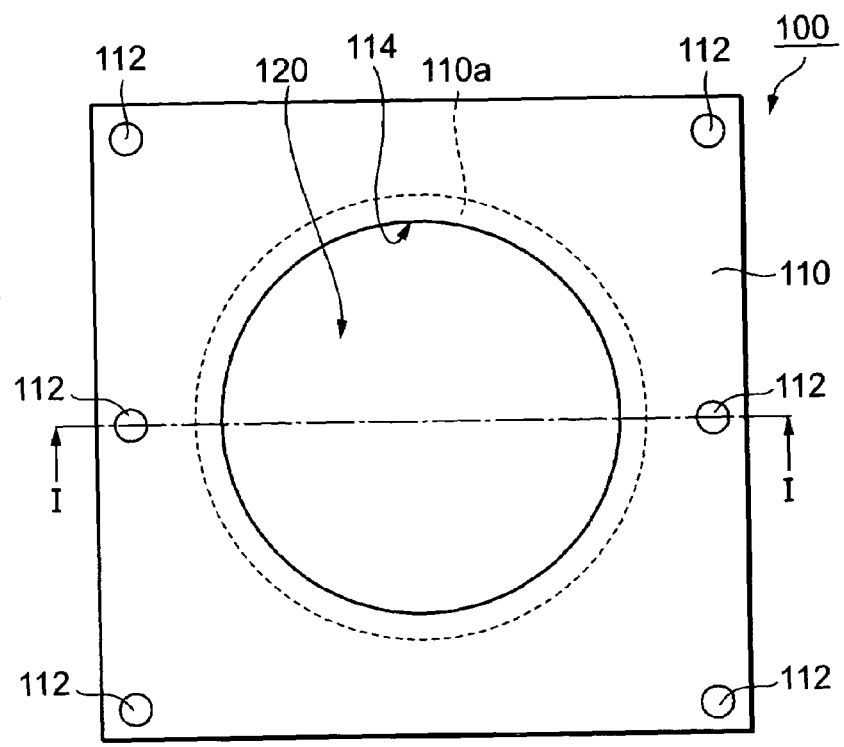
FIG. 4(A) is a schematic plan view of a first die as seen from the lower side (clamp side) in a state in which the first die has been put into place.
Figure 4B:
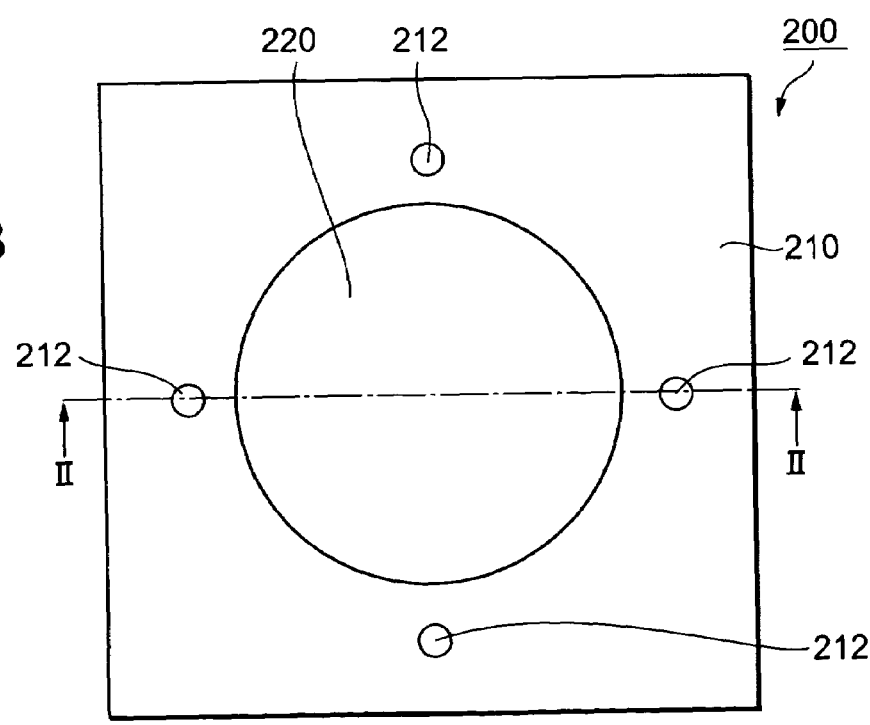
FIG. 4(B) is a schematic plan view of a second die as viewed from the upper side in a state in which the second die has been put into place in a manner similar to FIG. 4(A)

FIG. 4(A) is a schematic plan view of a first die as viewed from the lower side (clamp side) in a state in which the first die has been put into place, and FIG. 4(B) is a schematic plan view of a second die as viewed from the upper side in a state in which the second die has been put into place in a manner similar to FIG. 4(A), respectively.

Figure 5:
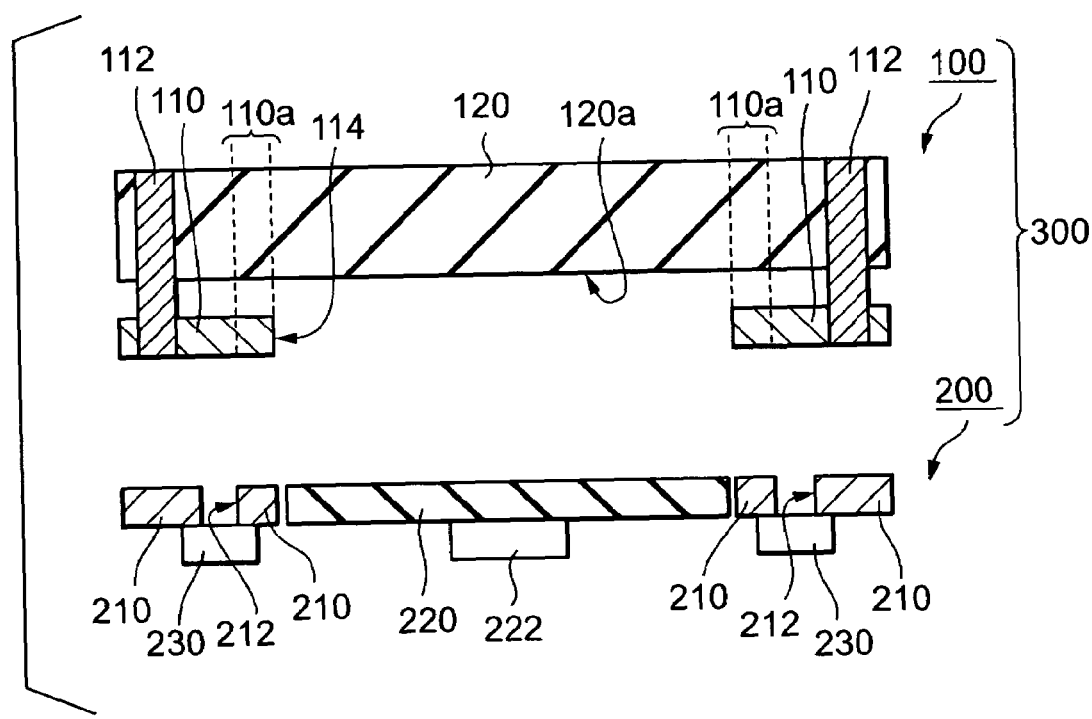
FIG. 5 is a schematic cross-sectional view showing the first and second dies with cut regions cut along dash lines I—I and II—II shown in FIGS. 4(A) and 4(B) as states in each of which a sealing device has been set up.

FIG. 5 is a schematic cross-sectional view showing the first and second dies in a state in which they are disposed in opposing relationship and a sealing device have been set up. In FIG. 5, the first and second dies 100 and 200 are shown in the form of cut regions cut along dashed lines I—I and II—II shown in FIGS. 4(A) and 4(B).

As shown in FIG. 5, a sealing device 300 suitable for use in the manufacturing method of the present invention includes the first die 100 and the second die 200. The first die 100 is provided on the upper side of the second die 200 so as to be opposed to the second die 200.

A die elevation mechanism (not shown) for adjusting a relative distance between the first die 100 and the second die 200 is provided for either one or both of the first die 100 and the second die 200 in a state in which they have been opposed to each other. The first and second dies are clamped by the die elevation mechanism so that a hermetically-sealed gap (hereinafter called simply "cavity") is formed by the first and second dies 100 and 200 (it will be described later). At this time, the clamped first and second dies can be moved up and down by the die elevation mechanism in a state in which the cavity is being maintained. A cavity intake/ exhaust means for evacuating the atmosphere or air in the cavity is connected to the cavity so as to be capable of sucking or exhausting.

The first die 100 has a first base 120. A substrate contact region 120a is set on the lower side of the first base 120. Support arms 112 regionttached to the first base 120 so as to surround it along the outer periphery of the first base while an interval that enables a semiconductor wafer to pass through is being maintained. In the present example, six support arms 112 regionttached so as to extend through the first base 120. Each of the support arms 112 is made up of a retractable function member such as a hydraulic cylinder.

A clamp 110 is provided on the lower sides of the support arms 112. A lower end of the support arm 112 extends through the clamp 10 and is fixedly secured thereto.

As shown in FIG. 4(A), the clamp 110 is formed with an opening 114 commensurate with the shape of a semiconductor wafer to be supported. A partial region having a predetermined width, which surrounds the opening 114 along the peripheral edge of the opening 114 of the claim 110, is set as a substrate support region 110a.

Since the substrate support region 110a is an region that corresponds to the peripheral region 11d of the semiconductor wafer 11 described using FIG. 2, the size of the opening 114 is set in matching with the semiconductor wafer and the peripheral region set to the semiconductor wafer, whereby a partial region lying within an arbitrary and suitable range may be set as the substrate support region 110a.

The second die 200 includes a second base 210. A stage 220 is provided in the center of the second base 210 so as to be disposed in opposition to the opening 114 of the clamp 110 provided in the first die 100. The second base 210 is formed with intake/exhaust holes 212 formed so as to surround the stage 220. The intake/exhaust holes 212 are provided with intake/exhaust mechanisms 230 for adsorbing mold-release films (called also "film-shaped members" and will be described in detail in the description of a manufacturing process) placed on the second base 210 and the stage 220. The intake/exhaust mechanism 230 comprises, for example, a vacuum pump and a tubing or pipe that connects the vacuum pump and the intake/exhaust hole 212. For example, the second die 200, i.e., either one or both of the second base 210 and the stage 220 may preferably be configured of a porous material having a large number of holes defined in micro scale. In this case, the intake/exhaust mechanism 230 may be connected to either one or both of the second base 210 and the stage 220.

The shape of the stage 220 may preferably be identical to that of the opening 114. The plane size of the stage 220 may preferably be set smaller than the size of the opening 114.

The stage 220 is provided with a stage elevation mechanism 222. The stage elevation mechanism 222 causes the stage 220 to move up and down freely. The stage elevation mechanism 222 may preferably be configured of, for example, a hydraulic cylinder, a servo motor or the like.

[Description of Encapsulating Process]

<First Embodiment>

An encapsulating process of a first embodiment will be explained with reference to FIGS. 6 and 7.

Figure 6A:
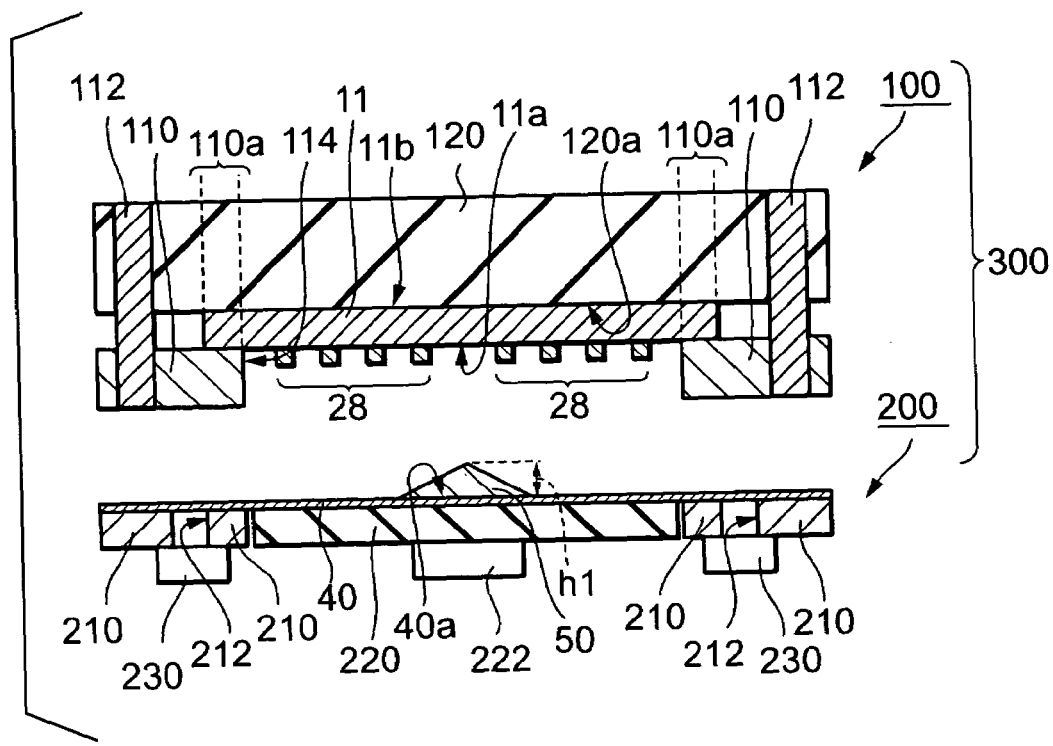
FIGS. 6(A) and 6(B) are respectively typical cross-sectional views for describing a sealing process of a first embodiment.
Figure 6B:
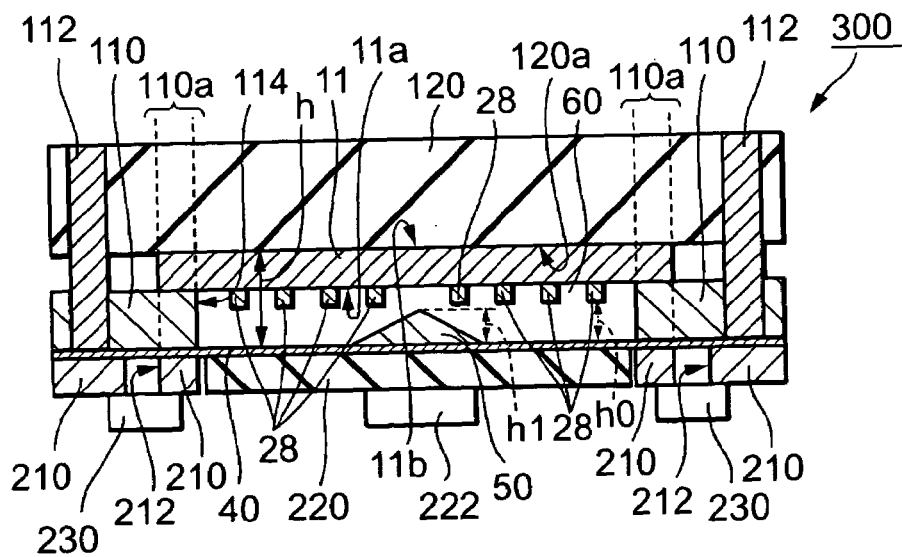

FIGS. 6(A) and 6(B) are respectively typical cross-sectional views for describing the encapsulating process of the first embodiment. A cut away portion or region of a cross section similar to FIG. 1(B) is typically shown.

Figure 7A:
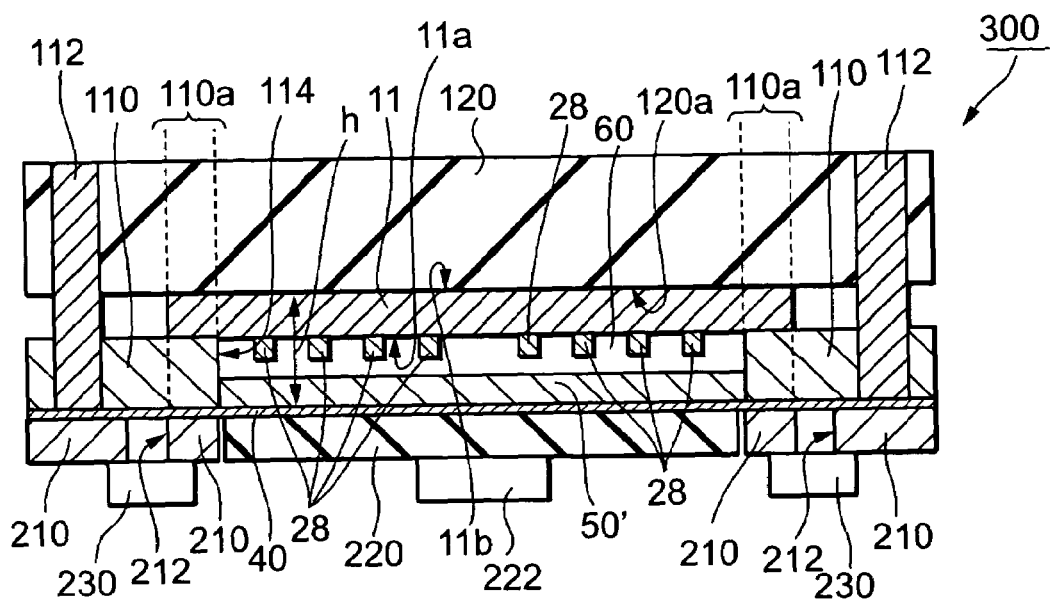
FIGS. 7(A) and 7(B) are respectively cross-sectional views following FIG. 6, for describing the sealing process of the first embodiment.
Figure 7B:
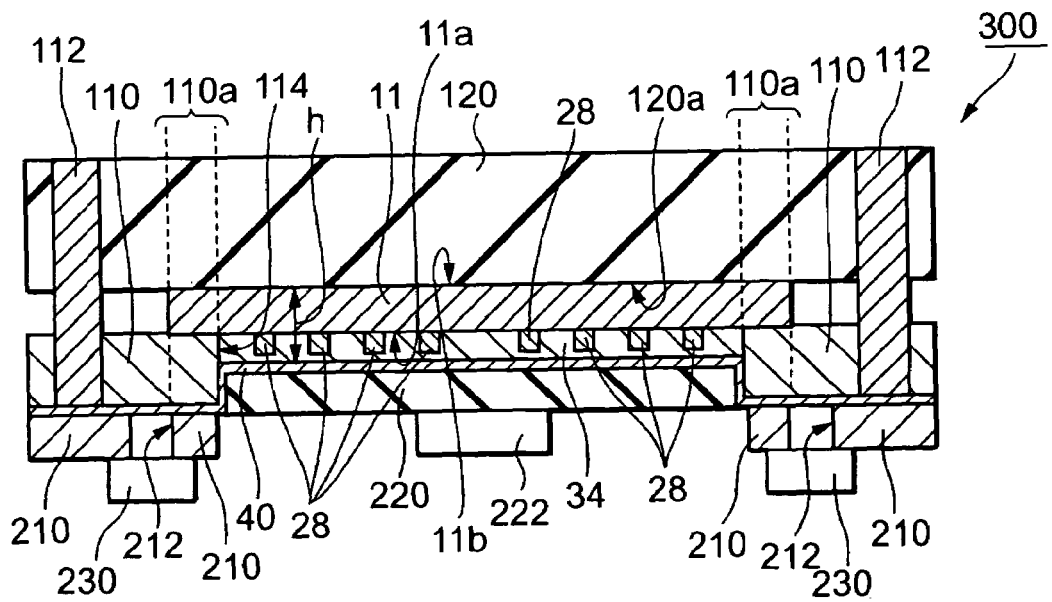

FIGS. 7(A) and 7(B) are respectively cross-sectional views following FIG. 6, for describing the encapsulating process of the first embodiment.

Incidentally, in the description of the following manufacturing process, a semiconductor wafer 11 will be defined as a structural body in which processing has been completed up to the process of forming the electrode posts 28 according to the wafer process shown in FIG. 3(B). In order to simplify illustrations and explanations, the device region 14, circuit element connecting pads 18, passivation film 20, insulating film 22, redistribution wiring layers 24 and electrode post pads 26, which have been actually formed, will not be illustrated and described. These structures will be explained as being included in the semiconductor wafer 11.

In the following description, the surface side of the insulating film 22 of such a structure as shown in FIG. 3(B) is defined as a first main surface 11a of the semiconductor wafer 11, and the surface opposite to the first main surface 11a is defined as a second main surface 11b. As shown in FIG. 2(A), the plurality of structural bodies brought to the semiconductor devices 10 by fractionalization regionctually arranged and formed in the semiconductor wafer 11 in matrix form. However, only the two structural bodies brought to the semiconductor devices 10 by fractionalization will be shown and described in the figures.

As shown in FIG. 6(A), a semiconductor wafer 11 is first placed on a substrate support region 110a of a clamp 110. The placement of the semiconductor wafer 11 thereon is carried out by causing the peripheral region 11d of the semiconductor wafer 11 shown in FIG. 2 to contact the substrate support region 110a. At this time, electrode posts 28 regionllowed to protrude from the upper side of an opening 114 to its lower side within the opening 114 of the clamp 110. That is, the first main surface 11a of the semiconductor wafer 11 is exposed from the opening 114.

Next, support arms 112 to which the clamp 110 is connected are shortened to thereby cause the second main surface 11b of the semiconductor wafer 11 to contact its corresponding substrate contact region 120a of a first die 100, whereby this contact state is maintained. For example, through holes, pipes connected thereto and an adsorption mechanism including a vacuum pump are provided in the substrate contact region 120a. In this state, the semiconductor wafer 11 may be adsorbed and held by the adsorption means and the clamp 110.

Next, a mold-release film 40 is placed on a second die 200, i.e., a second base 210 and a stage 220. A commercially available known mold-release film can be applied as the mold-release film 40. For instance, RM-4110 (trade name: it is manufactured by Hitachi Chemical Co., Ltd.) can be applied as the mold-release film 40. The mold-release film is 0.04 mm thick and has a double structure comprising a mold-release layer formed of an acrylic material and a base layer formed of a polyester material. A resin layout region 40a corresponding to an region on which a resin is to be placed in a subsequent process, is set to the mold-release film 40. The resin layout region 40a is set so as take over a partial region of the surface of the second die. Preferably, the center of the resin-layout region 40a may preferably be brought into alignment with the center of the opening 114 of the first die 100.

Then, the atmosphere or air is evacuated by intake/exhaust holes 212 and intake/exhaust mechanisms 230 connected thereto to adsorb and hold the mold-release film 40.

Next, the first die and the second die regionligned with each other in such a manner that the contour of the stage 220 of the second die 200 falls within the contour of the opening 114 of the first die 100.

Then, either one or both of the first and second dies are heated by an unillustrated heating mechanism such as a heater. This heating temperature will be described later. The heating mechanism may be replaced with a heating and cooling mechanism which is capable of cooling too.

Next, a predetermined amount of granular resin 50 is deposited on the resin layout region 40a of the mold-release film 40 in the form of, for example, a cone a by use of a measuring cup or a conventional known jig or the like. The shape of this deposition is not limited to the conical shape. Substantially conical or pyramidal shapes-having various bottom shapes can be applied.

A commercially available epoxy resin may preferably be used as the granular resin 50. A grain diameter of the granular resin 50 may be set to a range from 0.1 mm to 2 mm. Generally, an epoxy resin is brought into a state in which it is lowest in viscosity and high in liquidity within a range of 160° C. to 180° C. Further, such a state can be held for a long period of time. Thus, when the epoxy resin is used as the granular resin, the heating temperature of each die may preferably be set to the range of 160° C. to 180° C.

The amount of the granular resin 50 is determined in consideration of the size of an applied semiconductor wafer 11, specs of a semiconductor device 10 to be formed, i.e., the capacity of a finally-occupied encapsulating resin.

Described specifically, when the encapsulating process is effected on a semiconductor wafer 11 having a diameter of 8 inches, for example, the region to be sealed by the encapsulating resin on the semiconductor wafer 11 and the height of the encapsulating resin are multiplied and the volume occupied by each electrode post is subtracted from the determined volume (apparent volume of encapsulating resin), thereby calculating the resultant volume as a volume (true volume). In addition, the resin is normally shrunk or expanded in volume due to curing processing. Thus, the true volume is calculated in consideration of the shrinkage or expansion of the resin's volume due to the curing processing. The resin is converted into weight, based on the so-calculated true volume of encapsulating resin.

Assuming that the semiconductor wafer having the diameter of 8 inches (where 1 inch=2.54 cm), for example, is used and the converted weight of the required granular resin 50 is 12 g (grams), a circular region having a diameter of about 100 mm may preferably be set onto the mold-release film 40 as the resin layout region 40a. The resin may preferably be deposited on the resin layout region 40a so as to be brought into conical form having a thickness h1 of about 10 mm at the maximum.

Next, as shown in FIG. 6(B), the first die 100 and the second die 200 are clamped in contact with each other by means of a die elevation mechanism (not shown). At this time, die pressure may be set to a range in which no resin leaks. Described specifically, the pressure may be set to 10 t (tons) (98000N) to 60 t (tons) (588000N). Thus, a cavity 60 is defined by the first die 100 and the second die 200, i.e., the clamp 110 and the second base 210.

A height h of the cavity 60 at clamping, which is shown in FIG. 6(B), is defined by the first and second dies 100 and 200. The height h includes the thickness of the semiconductor wafer 11.

The granular resin may be deposited in such a manner that a distance h0 between the top surface of each electrode post 28 and the mold-release film 40 becomes a distance greater than the maximum thickness h1 of the granular resin 50, or the maximum thickness h1 of the granular resin 50 becomes smaller than the distance h0 therebetween.

Next, in a state in which the temperature is being maintained, the cavity 60 is pressure-reduced thereinside to a predetermined degree of vacuum set to about 133.3 Pa (pascal) (1 torr) even at the maximum by the cavity intake/exhaust means (not shown) which is connected to the cavity 60 so as to be capable of sucking or exhausting, in consideration of the occurrence of voids.

As shown in FIG. 7(A), the granular resin 50 gradually melts with a rise in the degree of vacuum, so that the granular resin 50 is spread gradually so as to cover the whole region of the surface of the mold-release film, equivalent to above the surfaces of the stage 220 and the second base 210. In the drawing, the state of the granular resin 50 being perfectly melted is shown as a molten resin 50'.

A time interval up to the predetermined degree of vacuum is adjusted so as to reach the predetermined degree of vacuum at least before the commencement of curing of the molten resin 50' in consideration of timing at which the curing of the resin begins.

When the epoxy resin is used as the granular resin 50 as mentioned above, a predetermined degree of vacuum may preferably be reached within five seconds since the granular resin is placed on the mold-release film 40, in consideration of the occurrence of the voids (the time at which the molten resin 50' begins to be cured).

With the timing substantially identical to the timing provided to start this pressure reduction, a stage elevation mechanism 222 is activated to gradually elevate the stage 220 as shown in FIG. 7(B) until a collection of air (void) in the cavity 60 disappears. Alternatively, the first and second dies are lowered by the die elevation mechanism in a state in which the stage 220 is being fixed, thereby to cause the collection of air (void) in the cavity 60 to disappear. As a result, the molten resin 50' is bonded to the first main surface 11a in contact with the first main surface 11a.

Thus, it is necessary to pressure-reduce the cavity 60 thereinside to a predetermined degree of vacuum at which the formation of voids in the encapsulating section is substantially prevented. Accordingly, the time required to cause the cavity 60 to reach the predetermined degree of vacuum thereinside may preferably be set shorter than the time required to cause the collection of air in the cavity 60 to perfectly disappear by virtue of the elevation of the stage 220 or deelevation or lowering down of the first and second dies. In other words, the distance at which the stage 220 is elevated or the first and second dies are lowered down, may preferably be set shorter than the distance between the molten resin 50' and the first main surface 11a within the time required to cause the cavity 60 to reach the predetermined degree of vacuum thereinside.

When the epoxy resin is used as the granular resin 50 as described above, the molten resin 50' is cured by further heating. This curing processing may preferably be set as a suitable process corresponding to the selected material for the encapsulating resin. With such curing processing, the molten resin 50' is formed as an encapsulating section.

As the configuration in which as described above, the encapsulating resin placed on the partial region on the second die, i.e., the stage 220 gradually melts and gradually spreads over the surface of the mold-release film, the time required to cause the cavity 60 to reach the predetermined degree of vacuum thereinside is set so as to be shorter than the time required to cause the collection of air in the cavity 60 to disappear perfectly by virtue of the elevation of the stage 220 or the lowering down of the first and second dies, and the time required to reach the predetermined degree of vacuum is set to (5 seconds or less) as mentioned above. By doing so, the occurrence of voids due to the collection of air caused by the encapsulating process can be effectively prevented and the encapsulating section can be formed with high yield and high accuracy.

After the completion of the curing processing of the encapsulating resin, the first and second dies 100 and 200 are released from clamping to thereby peel off the semiconductor wafer 11 out of the first die 100 and the mold-release film 40.

Next, the top surfaces of the electrode posts 28 are exposed by a grind process to thereby form external terminals.

Finally, a fractionalizing process is done to obtain a plurality of semiconductor devices 10.

<Second Embodiment>

An encapsulating process of a second embodiment will be explained with reference to FIG. 8. Incidentally, since a sealing or encapsulating device 300 applied to the second embodiment is identical to the device described in the first embodiment, the detailed description of components thereof is omitted. Since a point of difference between the encapsulating process of the second embodiment and the encapsulating process of the first embodiment resides only in the formation of a resin material placed on a stage 220, the detailed description of the same process steps is omitted.

Figure 8A:
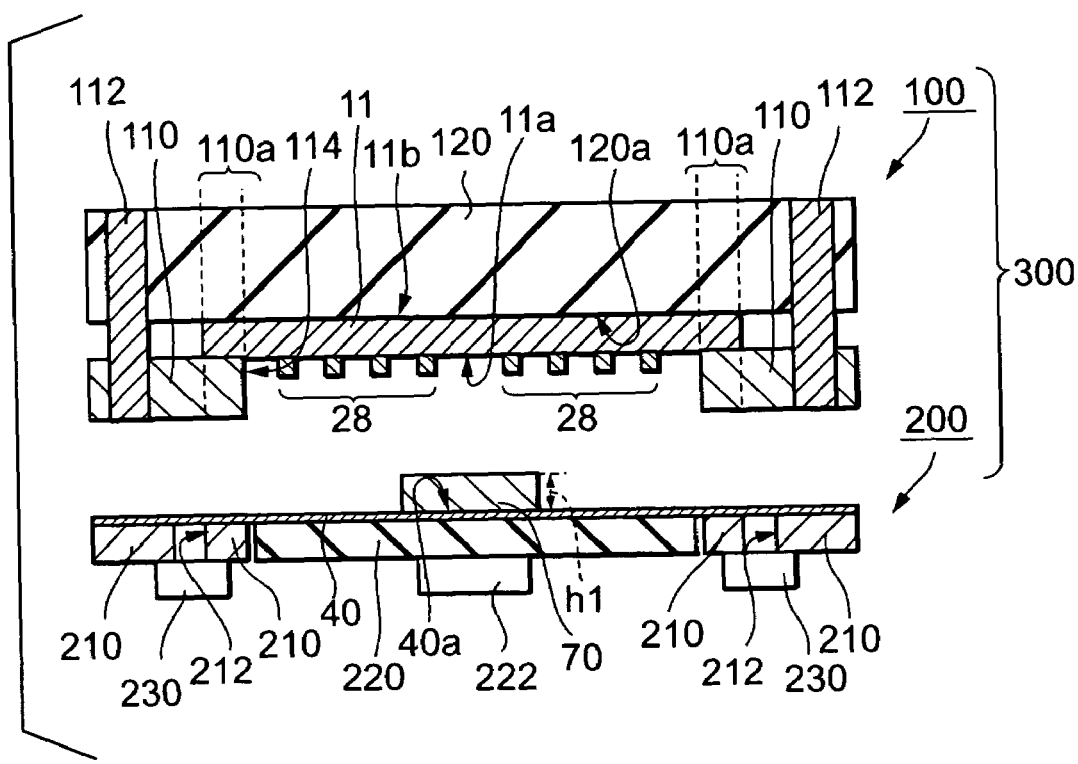
FIGS. 8(A) and 8(B) are respectively schematic cross-sectional views for describing a sealing process of a second embodiment.
Figure 8B:
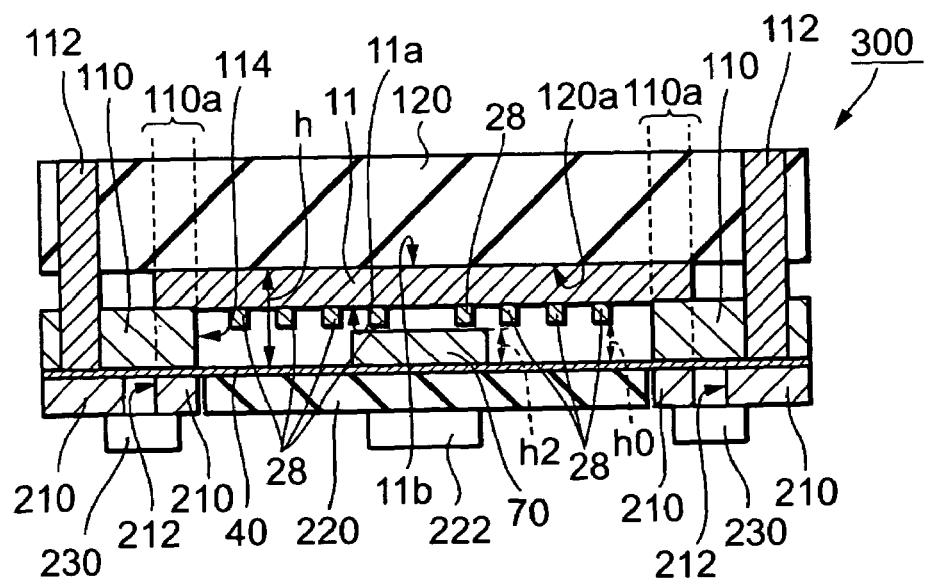

FIGS. 8(A) and 8(B) are typical cross-sectional views for describing the encapsulating process of the second embodiment. A cut away portion or region of a section similar to FIG. 1(B) is typically illustrated.

As shown in FIG. 8(A), a semiconductor wafer 11 is placed on a substrate support region 110a of a clamp 110 in such a manner that the peripheral region 11d of the semiconductor wafer 11 shown in FIG. 2 is brought into contact with the substrate support region 110a. At this time, a first main surface 11a of the semiconductor wafer 11 is exposed through an opening 114 from the upper side of the opening 114 of the clamp 110 to its lower side.

Next, a second main surface 11b of the semiconductor wafer 11 is held in contact with a substrate contact region 120a of a first die 100.

Next, a mold-release film 40 is placed on a second die 200, i.e., a second base 210 and the stage 220. A resin layout region 40a corresponding to an region on which a resin is to be placed in a subsequent process, is set to the mold-release film 40.

Then, the atmosphere or air is evacuated by intake/exhaust holes 212 and intake/exhaust mechanisms 230 connected thereto to adsorb and hold the mold-release film 40.

Next, the first die 100 and the second die 200 regionligned with each other in such a manner that the contour of the stage 220 of the second die 200 falls within the contour of the opening 114 of the first die 100.

Then, either one or both of the first and second dies are heated by an unillustrated heating mechanism.

Next, a resin pellet 70 molded in pellet form is placed on the resin layout region 40a of the mold-release film 40.

The resin pellet 70 is preferably formed with a commercially available epoxy resin as the material.

The weight of the resin pellet 70, in other words, the amount of the resin encapsulating material is determined in consideration of the size of an applied semiconductor wafer 11, specs of a semiconductor device 10 to be formed, i.e., the capacity of a finally-occupied encapsulating resin in a manner similar to the first embodiment.

A granular or powdered encapsulating resin material equivalent to the weight converted in a manner similar to the first embodiment is molded (tablet-punched) in pellet form in the present embodiment.

This molding process will be described below. The conventionally known so-called simple tablet-punching machine can be used in the molding process. The detailed description of a configuration of the simple tablet-punching machine is omitted.

A granular resin having a weight converted based on the volume subsequent to curing processing is charged into a die or mold having a desired shape according to the above-mentioned procedure. Assuming that the volume occupied within the die by the granular resin upon its charging is 100%, the granular resin is compressed and tablet-punched so as to reach a resin pellet having a cubic volume ranging from, preferably, 30% to 70% thereof. The hardness of the resin pellet 70 is preferably set to hardness of such a degree as not to break even if it is held by hand, for example. Although not restricted in particular, the shape of the resin pellet 70 needs to be spread over the mold-release film 40 by its melting as a shape close to the shape of the semiconductor wafer 12. Therefore, the shape thereof may preferably be cylindrical.

Although a plan size of the resin pellet 70 is not restricted in particular, there is a need to take into consideration its thickness h2 (to be described later). As pressure applied to the granular resin and a pressure time interval, arbitrary and suitable conditions can be selected if a desired volume is reached after its application of pressure.

Next, the first die 100 and the second die 200 regionligned with each other in the above-described temperature-held state in such a manner that the contour of the stage 220 of the second die 200 falls within the contour of the opening 114 of the first die 100.

Next, as shown in FIG. 8(B), the first die 100 and the second die 200 are clamped in contact with each other by means of a die elevation mechanism (not shown). Thus, a cavity 60 is defined by the first die 100 and the second die 200, i.e., the clamp 110 and the second base 210.

A height h of the cavity 60 at clamping, which is shown in FIG. 8(B), is defined by the first and second dies 100 and 200. The height h includes the thickness of the semiconductor wafer 11.

A distance h0 between the top surface of each electrode post 28 and the mold-release film 40 may be set so as to reach a distance greater than the thickness h2 of the resin pellet 70, or the thickness h2 of the resin pellet 70 may be set so as to become smaller than the distance h0 therebetween.

Next, in a state in which the temperature is being maintained, the cavity 60 is pressure-reduced thereinside to a predetermined degree of vacuum by the cavity intake/exhaust means which is connected to the cavity 60 so as to be capable of sucking or exhausting.

The resin pellet 70 gradually melts with a rise in the degree of vacuum, so that the resin pellet 70 is gradually spread so as to cover the whole region of the surface of the mold-release film, equivalent to above the surfaces of the stage 220 and the second base 210.

A time interval up to the predetermined degree of vacuum is adjusted such that the predetermined degree of vacuum is reached at least before the commencement of curing of the molten resin in consideration of timing at which the curing of the resin begins.

When the epoxy resin is used as the resin pellet 70 as mentioned above, a predetermined degree of vacuum may preferably be reached within five seconds since the resin is placed on the mold-release film 40, in consideration of the occurrence of the voids (the time at which the molten resin begins to be cured).

With the timing substantially identical to the timing provided to start this pressure reduction, the stage elevation mechanism 222 is activated to gradually elevate the stage 220 as shown in FIG. 7(B) until a collection of air (void) in the cavity 60 disappears. Alternatively, the first and second dies are lowered down by the die elevation mechanism in a state in which the stage 220 is being fixed, thereby to cause the collection of air (void) in the cavity 60 to disappear. As a result, the molten resin is bonded to the first main surface 11*a* in contact with the first main surface 11*a*.

Thus, it is necessary to pressure-reduce the cavity 60 thereinside to a predetermined degree of vacuum at which the formation of voids in the encapsulating section is substantially prevented. Accordingly, the time required to cause the cavity 60 to reach the predetermined degree of vacuum thereinside may preferably be set shorter than the time required to cause the collection of air in the cavity 60 to perfectly disappear by virtue of the elevation of the stage 220 or deelevation or lowering down of the first and second dies. In other words, the distance at which the stage 220 is elevated or the first and second dies are lowered down, may preferably be set shorter than the distance between the molten resin and the first main surface 11*a* within the time required to cause the cavity 60 to reach the predetermined degree of vacuum thereinside.

When the epoxy resin is used as the resin pellet 70 as described above, the molten resin is cured by further heating. This curing processing may preferably be set as a suitable process corresponding to the selected material for the encapsulating resin. With such curing processing, the molten resin is formed as an encapsulating section.

After the completion of the curing processing of the encapsulating resin, the first and second dies 100 and 200 are released from clamping to thereby peel off the semiconductor wafer 11 out of the first die 100 and the mold-release film 40.

Next, the top surfaces of the electrode posts 28 are exposed by a grind process to thereby form external terminals.

Thus, an effect similar to the first embodiment can be obtained even where the resin pellet 70 is applied to the encapsulating process. Since the encapsulating resin material is formed in pellet form in advance, the working of placement of the encapsulating resin material on the second die can be smoothly carried out without using the supply means such as the jig. Accordingly, the manufacturing process can be further simplified.

The method of manufacturing the semiconductor device, according to the present invention is suitable for application to the so-called WCSP. According to the resin encapsulating process of the present invention, since no granular resin is brought into contact with the electrode posts upon evacuation of the cavity in the dies, the electrode posts can be effectively prevented from being deformed. Owing to the provision of the mold-release film, the peeling of the encapsulating resin from the die becomes easy. Accordingly, a high reliable semiconductor device can be manufactured at high yield levels.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A method of manufacturing a semiconductor device, comprising:
   (a) preparing a semiconductor wafer including a first main surface and a second main surface opposite to the first main surface, the first main surface having a semiconductor device forming region and a peripheral region which surrounds the semiconductor device forming region;
   (b) preparing first and second dies which define a cavity;
   (c) holding the semiconductor wafer by the first die so that the first main surface is exposed;
   (d) placing a film member on the second die;
   (e) supplying a predetermined amount of resin to a predetermined region on a resin layout region of the film member;
   (f) heating the first die and the second die;
   (g) bringing the first die and the second die into contact with each other through the film member to form the cavity, thereby the first main surface and the resin are placed in the cavity; and
   (h) pressure-reducing the interior of the cavity and reducing the capacity of the cavity to cause the molten resin obtained by melting the resin to contact the first main surface, thereby forming an encapsulating portion on the first main surface.

2. A method according to claim 1, wherein the resin supplied in said step (e) is granular.

3. A method according to claim 2, wherein the granular resin is substantially conically supplied onto the film member.

4. A method according to claim 1, wherein the resin supplied in said step (e) is a resin pellet obtained by forming the granular resin in a predetermined shape.

5. A method according to claim 4, wherein the resin pellet is formed by compressing and tablet-punching the granular resin so as to assume a volume lying in a range of 30% to 70% of a volume thereof placed in a granular state.

6. A method according to claim 1, wherein protruded electrodes are formed on the first main surface and the thickness of the resin supplied in said step (e) is set so as to be shorter than a distance between a top surface of each of the protruded electrodes and the film member.

7. A method according to claim 1, wherein in said step (h), the pressure-reduction of the cavity is effected up to a predetermined degree of vacuum at which no voids are defined in the encapsulating section, and the reduction in the capacity of the cavity is stopped after the cavity has reached the predetermined degree of vacuum.

8. A method according to claim 7, wherein the reduction in the capacity of the cavity is executed by elevating a movable stage constituting the second die to the first die, and the distance at which the stage is elevated during a pressure-reducing time required to cause the cavity to reach the predetermined degree of vacuum since the commencement of the pressure-reduction of the cavity, is set shorter than a distance between the molten resin and the first main surface.

9. A method according to claim 1, wherein in said step (h), the degree of vacuum of the cavity placed under the pressure-reduction is gradually pressure-reduced up to 133.3 Pa even at the maximum.

10. A method according to claim 1 wherein said steps (e) through (h) are executed in five seconds even at the maximum.

* * * * *